United States Patent [19]

Pelrine

[11] Patent Number: 5,099,216

[45] Date of Patent: Mar. 24, 1992

[54] MAGNETICALLY LEVITATED APPARATUS

[76] Inventor: Ron Pelrine, 1300 Spyglass Dr., #106, Austin, Tex. 78746

[21] Appl. No.: 267,258

[22] Filed: Nov. 4, 1988

[51] Int. Cl.$^5$ .............................................. H01F 7/08
[52] U.S. Cl. .................................. 335/220; 335/229; 335/266
[58] Field of Search ............... 335/220, 221, 222, 229, 335/243, 249, 266, 268, 280; 104/281, 284; 901/40; 273/1 GB; 446/134, 135, 132, 131

[56] References Cited

U.S. PATENT DOCUMENTS

| 3,376,578 | 4/1968 | Sawyer | 346/29 |
|---|---|---|---|
| 3,457,482 | 7/1969 | Sawyer | 318/38 |
| 3,806,782 | 4/1974 | Matsui et al. | 318/135 |
| 4,578,044 | 3/1986 | Saitoh | 446/134 |
| 4,585,282 | 4/1986 | Bosley | 308/10 |
| 4,643,034 | 2/1987 | Favatella | 74/5.46 |
| 4,654,618 | 3/1987 | Leupold | 335/304 |

FOREIGN PATENT DOCUMENTS

588192  5/1947  United Kingdom ................ 446/134

OTHER PUBLICATIONS

R. Pelrine, et al., "Magnetically Levitated Micro-Machines," Nov. 9, 1987, IEEE Proceedings Micro Robots and Teleoperators Workshop, Hyannis, MA.

R. Pelrine, "Magnetically Levitated Micro-Robotics," Ph.D. Dissertation, University of Texas at Austin, Dec. 1988.

R. Pelrine, "Maglev Micro-Robotics: An Approach Towards Highly Integrated Small-Scale Manufacturing Systems," IEEE/CHMT International Electronic Manufacturing Technology Symposium Proceedings 1989, San Francisco, CA, Sep. 25, 1989, pp. 273-276.

R. L. Hollis, et al., "A Six Degree-of-Freedom Magnetically Levitated Variable Compliance Fine Motion Wrist," Aug. 9, 1987, 4th International Symposium on Robotics Research, Santa Cruz, CA.

*Primary Examiner*—Leo P. Picard
*Assistant Examiner*—Bot L. Ledynh

[57] ABSTRACT

A magnetically levitated apparatus and method for controlling the motion of robotic manipulators. The magnetic levitation system comprises freely mobile manipulators, with attached magnetically active components, such as permanent magnets or superconducting magnets. Linear and rotational forces are imposed on the manipulator by means of externally generated magnetic fields, such as electromagnets. The arrangements of magnetic components on the manipulators, and the magnetic field sources in the environment of the manipulators determine the precision of control and degrees of freedom that the manipulators possess at any given location in the system. The manipulators may function with more than one degree of freedom with high precision at one or more locations with the system, with low precision and limited degrees of freedom in other locations in the system. Various methods are applied to provide stability and damping of the individual manipulators without requiring constant feedback. Electrical signals and power are provided to and from the manipulators without the requirement of a motion-restricting cable, tether or wire.

23 Claims, 11 Drawing Sheets

MAGNETICALLY LEVITATED APPARATUS

BACKGROUND OF THE INVENTION

This invention relates to a magnetically levitated apparatus and a related method for doing useful work.

BACKGROUND PRIOR ART

Methods and apparatus for providing magnetic levitation have been known in the art for quite some time. For example, magnets are used to support objects in a single location. An example of such a patent is Favatella, U.S. Pat. No. 4,643,034 (1987), which is intended to levitate an object at a single equilibrium point so as provide a free-floating magnetically suspended gyroscope. Other devices utilize magnets to create static magnetic fields. For example, Leupold, U.S. Pat. No. 4,654,618 (1987), discloses the use of permanent magnets rather than electromagnetics, specifically the use of rare earth permanent magnet materials, and confining koe magnetic fields to very small areas in miniature devices.

Further, magnetic forces have been used for the support of extremely heavy and fast moving objects such as trains. Matsui et al., U.S. Patent No. 3,806,782 (1974), disclose an electromagnetic rail for driving a train by semi-conductor controlled rectifier linear motors. Still other patents disclose systems for magnetic levitation in general. Bosley, U.S. Pat. No. 4,585,282 (1986), discloses a magnetic levitation apparatus utilizing an arrangement of permanent magnets, one or more electromagnets, and position and motion sensors plus electronic circuitry to effectively support the weight of and control the position of a levitated object.

A drawback to the magnetic levitation apparatus and methods known in the art is that none provide for a freely mobile magnetically levitated robot capable of movement in six independent degrees of freedom, three translational and three rotational, for the accomplishment of precision work in a workspace. Further, the requirement to stabilize the magnetically levitated device and to dampen the motion of the device once levitated is critical. Also missing from magnetic levitation apparatus and methods known in the prior art are non-magnetic means for preferentially inhibiting certain degrees of freedom of the levitated manipulator, while leaving other degrees of freedom essentially uninhibited. Such magnetic levitation apparatus and methods missing from the prior art would simplify the precise control of the levitated manipulator by being used, for example, after the desired position has already been achieved in the inhibited degrees of freedom, or at all times for tasks requiring little or no motion in the inhibited degrees of freedom.

Additionally, the ability to utilize magnetic levitation for accomplishment of precise tasks by means of a micro-robot transported to the precision workspace and removed therefrom by means of magnetic path ways is also missing from the prior art. A further drawback to the magnetic levitation apparatus and methods known in the art is that none provide for electrical signals to flow both to and from the levitated device without motion restricting cables attached to said device, and none provide for liquids to flow to and from a levitated device without attached tubes or pumps carried by said device.

Thus, there is a need in the art for providing a magnetically levitated apparatus, and method therefor, for accomplishing various tasks in a precision workspace that is capable of six degrees of freedom of motion and is connected by means of transport paths to and from the precision workspace. It, therefore, is an object of this invention to provide a magnetic levitation apparatus, and method therefore, with multiple degrees of freedom with high precision, and which may also provide for low precision transport devices within the same integrated system.

OBJECTS

It is a primary object of the present invention to provide a method and various apparatus to control the motion of small manipulators with high precision with multiple degrees of freedom using magnetic forces.

It is a further object of the present invention to provide a method and apparatus to provide stability and damping to the motion of the manipulator while maintaining precision and multi-degrees of freedom without the use of sensor feedback.

It is a further object of the present invention to provide a method and apparatus for obtaining electrical connection to the manipulator without the use of a connecting wire, tether, or cable.

It is a further object of the present invention to provide a method and apparatus for making controlled contact between a levitated manipulator and other materials (solids and liquids) in such a way as to inhibit motion of the manipulator in certain degrees of freedom while leaving other degrees of freedom uninhibited, thereby simplifying the control problem during times when six degrees of freedom control is not needed or when only limited motion is needed in some degrees of freedom.

It is a further object of the present invention to provide a method and apparatus to allow the manipulators to move from their precision workspaces onto low precision, low degree of freedom, transport paths, thus forming a uniquely integrated system adaptable to a manufacturing environment.

It is a further object of the present invention to provide a method and apparatus to provide low-precision processing, such as chemical processing and low-precision machining at one or more locations, or continuously along low-precision transport paths.

It is a further object of the present invention to provide a method for fabricating both the low-precision transport paths and the high-precision workspaces.

SUMMARY

This invention relates to magnetic levitation and direct current linear motor devices, particularly to the arrangement and fabrication of magnetic components, structural geometry, and stabilizing methods used by such devices to construct programmable freely mobile manipulators which may be operated with multiple degrees of freedom with high precision, and which may also function as low precision transport devices within the same integrated system. The invention further relates to apparatus and methods of providing electrical signals and power to and from the manipulators without the use of motion constraining wires, tethers, or cables and to apparatus and methods of transferring liquids to and from the manipulators without motion constraining tubes or pumps. carried by the manipulators.

Mechanical automation in the factory generally serves two broad purposes; (i) to provide for transport of materials and tools to the areas where actual processing will be done, and (ii) to provide precision processing of the product (e.g., machining and assembly tasks). There has been some development of mobile wheeled robots used for material transport. Robots have, however, usually been restricted to precision processing. Relevant literature demonstrates the difficulty of integrating precision mechanics with transport mechanics in complex systems such as a factory.

Micro-robotics is a subfield of robotics concerned with making small, programmable manipulators with multiple degrees of freedom. A major technical problem in building micro-robots, and micro-machines in general, is that as machines are made smaller, friction becomes a relatively more important design problem, and machines become increasingly difficult to control. Other problems in smaller-scale machines include wear and the control of intrinsically faster devices.

The present invention relates to factory automation in general, and relatively small machines in particular. Magnetic levitation is used to reduce friction and wear in small manipulators. The manipulators are designed to be unattached so that they can move freely from workspaces designed for precision processing onto simple limited-dimensional pathways or tracks designed for material and tool transport. Typically, the precision workspace contain the complex arrangements of electromagnetics to control the manipulator in many degrees of freedom, and also may contain sensors to give precise motion control of the manipulator. Since most of the cost of such a system is associated with the precision workspaces, not the manipulators themselves or the transport paths, it is economical to use the same manipulators for both transport and precision tasks. As one manipulator leaves a precision workspace to enter a transport path, another manipulator can then move into and use the vacated precision workspace, for example.

Accordingly, the magnetically levitated device and method of the present invention includes two sets of magnets, wherein one set is a set of controllable, electromagnets, and one set is a set of non-controllable magnets or induced magnets. A precision workspace is provided where one set of the magnets is fixed and a manipulator, for conducting precision tasks in the precision workspace, is attached to another set of magnets so that the combination of the two sets of magnets, one controllable and one not, enables the manipulator freedom of movement in six independent degrees, three translational and three rotational. The controllable electromagnetic magnets are controlled by means of a computer connected thereto so that the magnetic forces produced thereby are adjustable. Stabilizing and motion damping of the manipulator is accomplished in one of several ways. A solid form can be utilized upon which the manipulator comes into contact and thereby stabilizes and damps its motion or comes to a rest after movement. The solid form and/or the manipulator can be shaped in such a way that when the two come in contact, friction or other contact forces perferentially inhibit certain degrees of freedom or motions of the manipulator, while leaving other degrees of freedom or motions of the manipulator essentially uninhibited. Since magnetic forces can be used to move the manipulator away from the solid form to reduce or break contact, inhibited degrees of movement can become uninhibited or released. This allows the previously inhibited degrees of movement to be accurately positioned as well. The advantage of shaping the solid form and/or the manipulator is that inhibiting certain degrees of movement at desired times can reduce the demands on the magnetic control means, as, for example, when the manipulator has achieved its desired position in these degrees of movement. This solid form can be made of electrically conductive material so that electric signals and power can be directed to and from the manipulator. Further, the solid form and the material to be worked can be one and the same.

Additionally, stabilizing and motion damping can be provided by means of liquid(s) which can also be electrically conductive. Further, benefit can be derived from this liquid form by shaping the manipulator in such a way as to restrict or inhibit motion in some degrees of freedom when the manipulator is in contact with the liquid, while leaving other degrees of freedom uninhibited. This is useful in tasks which require little or no motion in some degrees of freedom. It is possible that the manipulator can be totally immersed in the liquid.

The liquid(s) can be of a type responding to capillary action, so that if suitable capillary material is placed on the manipulator, liquid will flow by capillary action onto the manipulator for transport or precise placement purposes. Additionally, these solid and liquid stabilizing and motion damping forms can be combined. Finally, stabilizing and motion damping can be accomplished by utilization of a superconductor.

In the preferred embodiment, the controllable electromagnetic means, for the production of variable magnetic forces, are arranged on one side of half a plane so as to provide the six degrees of freedom of motion while enabling access to and from a precision workspace. The electromagnets are cylindrically shaped, in a preferred embodiment, and spaced so that the centers of the cylindrically shaped electromagnetic means form an equilateral triangle. One set of three such cylindrically shaped electromagnets form a top set and another set of three form a bottom set. These top and bottom sets are joined so that the central axes of the top set are offset from the central axes of the bottom set by some factor, preferably one half, of a common radius of the electromagnetic magnet. This configuration results in an electromagnet, controllable through a computer, that creates variable magnetic forces capable of manipulating the manipulator as desired and, specifically for precision tasks.

The manipulator may also have contact members attached to it so that the manipulator is supported on the contact members. These contact members can also be utilized in conjunction with an end effector that is designed to accomplish the precise task desired, e.g. making electrical contact, sampling information, grasping, etc. The pin member can be utilized in conjunction with the end effector to transport fluid to the end effector or to transmit mechanical power from the pin member to the end effector or even to transmit light to the end effector.

The manipulator can be constructed from multiple magnets or from a single magnet formed as desired.

A preferred embodiment of the invention includes the addition of a transport path upon which manipulators are moved to and from the precision workspace. The transport path can be comprised of an electromagnetic magnet, even a single wire electromagnetic magnet, that is capable of moving the manipulators in a limited degree of motion. As a result, the manipulators, while on the transport path, can also be utilized not only to move into and out of the precision workspace, but to accomplish low-precision tasks outside of the precision workspace.

In general, the present invention comprises several sources of magnetic fields (hereinafter referred to as "field sources") fixed in a workspace environment. The field sources generate forces and torques by acting on magnetic dipole moments attached to each manipulator (the material or devices, e.g. permanent magnets, or air-core electromagnets, which generate the dipole moments will be referred to as "dipole sources"). Since the manipulator is intended to be controllable, either the field sources and/or the dipole sources must be electrically controllable; that is, one or the other must be electromagnets. The dipole and field sources may be chosen from any known active magnetic components, including permanent magnets, superconducting magnets, induced ferro-magnets, induced eddy-current magnets, iron core electromagnets, superconducting electromagnets, and air core electromagnets. In the preferred embodiment of the present invention, the field sources comprise air core electromagnets and the dipole sources comprise permanent magnets.

The geometry of the field sources and the dipole sources are arranged to provide the desired degrees of freedom to a manipulator. In the preferred embodiment, the geometry of the manipulator is triangular, and six air core electromagnets are arranged in the precision workspace in a pattern to provide six degrees of freedom, with minimal error, in the required forces and torques. The field geometry may vary in different locations of a system depending upon the desired function.

The manipulator is intended to function without continuous attachment to any fixed location. Two methods are presented to provide electrical transmission from the environment to the manipulator. As previously discussed, the first comprises a solid contact pad made out of a conductor. When electrical contact must be made with the manipulator, the manipulator touches the contact pad. In a probing application, for example, the manipulator simultaneously touches the contact pad and the object to be probed. A second method is to move the manipulator in or on a conducting fluid. Electrical continuity is provided from the object to be probed, through the manipulator, and into the conductive fluid.

A well-know problem in magnetic levitation is stabilizing the motion of the levitated object. Three methods of providing stability and damping to a magnetically levitated manipulator without the necessity of an active sensor feedback loop have been presented. The first is to use the solid contact pad or other solid surface mentioned above. In this method the manipulator may be moved in free space without touching, but may be manipulated to touch the solid surface periodically once stability is desired. The solid surface provides stability and damping in the direction perpendicular to the plane of the surface, and in the directions horizontal to the plane of the surface because of friction. The solid surface may be placed in any orientation. If the surface is placed above the manipulator, gravity forces pull the manipulator away from the surface with a known force. With the solid surface method of stabilization, in one embodiment, small needle like legs, contact members, may be placed on the manipulator to minimize the area of surface contact, thus minimizing some forms of friction.

BRIEF DESCRIPTION OF THE DRAWINGS

Other objects, features, and advantages of the present invention will become more fully apparent from the following detailed description of the preferred embodiment, the appended claims, and the accompanying drawings in which:

DETAILED DESCRIPTION OF THE PREFERRED EMBODIMENT

Figure 1:
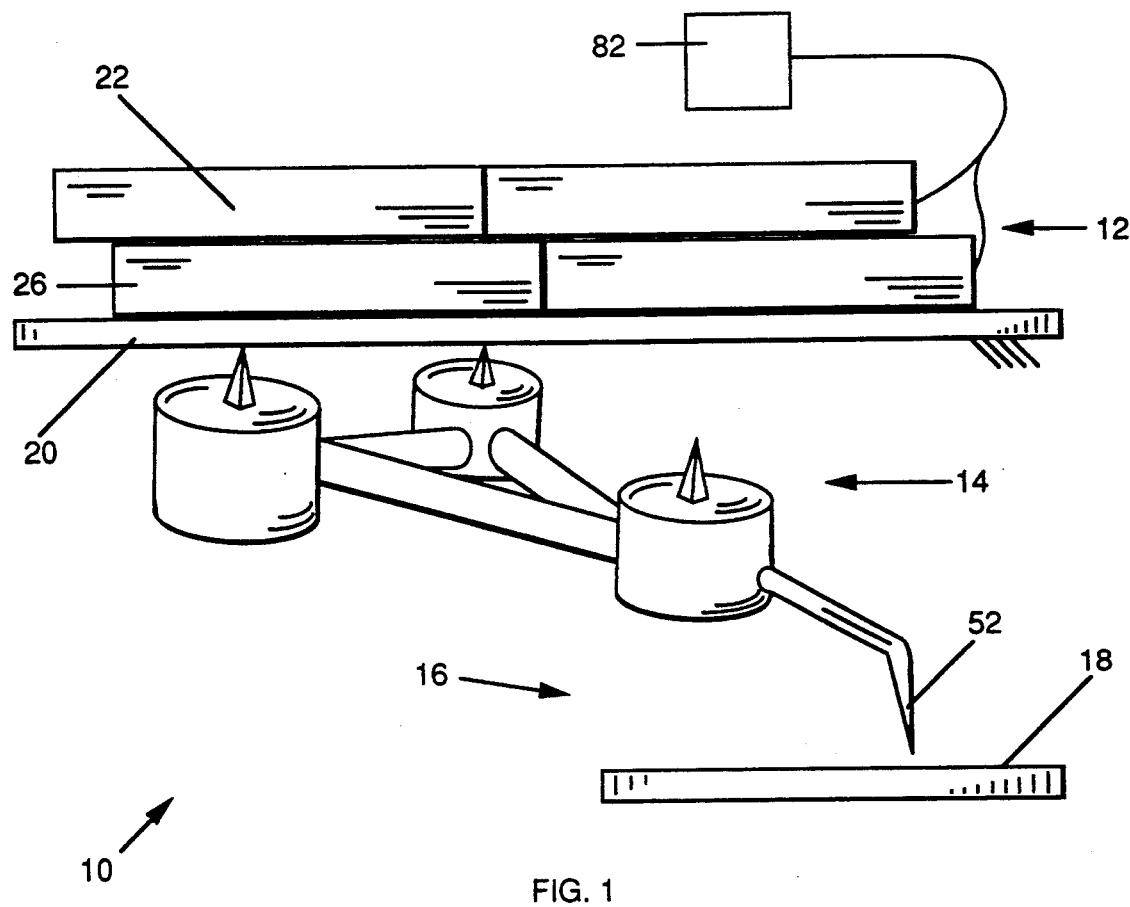
FIG. 1 is a side view of a preferred embodiment of the magnetically levitated mechanism of the present invention.

The preferred embodiment of the present invention is illustrated by way of example in FIGS. 1-20. With specific reference to FIGS. 1 and 2, a magnetically levitated system 10 includes electromagnets 12, manipulator 14, programmable control means 82, precision workspace 16, and process material 18. Also shown in FIG. 1 is solid surface 20 providing stability and motion damping for manipulator 14.

Figure 2:
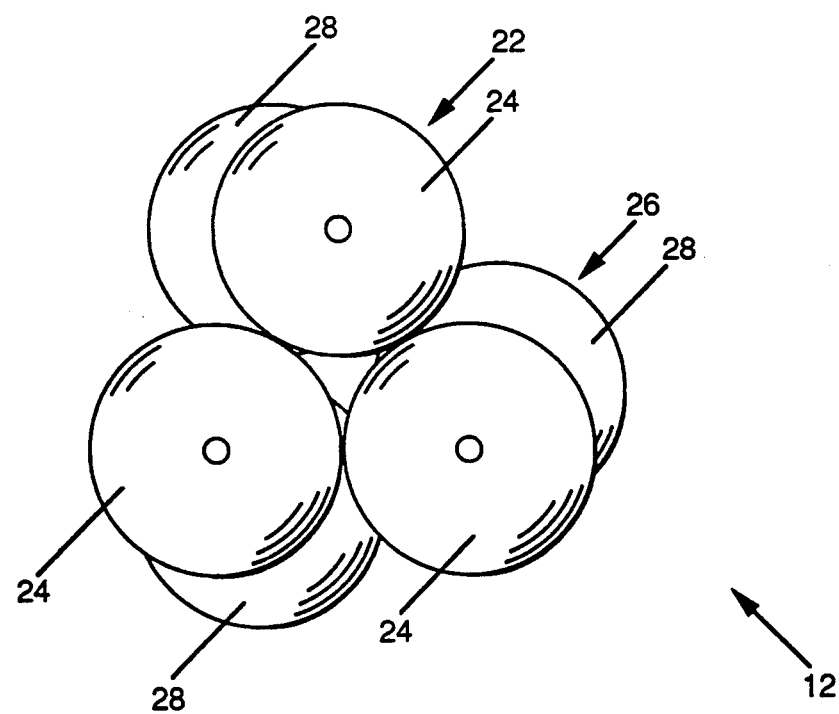
FIG. 2 is a top view of six electromagnets depicting arrangement in the preferred embodiment of the present invention.

Referring to FIG. 2, a top view of a preferred embodiment of electromagnets 12 is shown. Electromagnets 12, in the preferred embodiment, are cylindrical in shape. A top set 22 of electromagnets 12 is comprised of cylindrically shaped electromagnets 24 contiguous at their radial surfaces and bottom set 26 is composed of cylindrically shaped electromagnets 28. As shown in FIG. 1, top set 22 and bottom set 26 are contiguous along one plane, or side, with each other. Further, by referring to FIG. 2, it can be seen that the central axes of electromagnets of the top set 22 of cylindrically shaped electromagnets 24 are offset from the central axes of the bottom set 26 of cylindrically shaped electromagnets 28. The preferred factor by which the top and bottom set of electromagnets 12 are offset is by a factor of $\frac{1}{2}$ of the common radius of electromagnets 24 and 28.

In the preferred embodiment, electromagnets 12 are air core electromagnets and are used to generate the mode of magnetic fields of the invention. The pattern of the electromagnets described above is designed to give a full six degrees of freedom of control to manipulator 14. That is, three translational and three rotational degrees of freedom. Importantly, the electromagnet geometry discussed above is also designed to minimize power consumption and error in the generated forces and torques. Additionally, other geometric arrangements of electromagnets are possible outside the preferred embodiment.

Electromagnets 12 generate complex magnetic fields that act on magnet material on the manipulator 14, discussed more fully hereafter. Electromagnets 12 are controlled by a computer, or programmable control means, 82, with or without feedback. As discussed more fully in FIGS. 6a through 8b, computer control of electromagnets 12 can be accomplished and programmed to provide the above described six degrees of motion.

Figure 3:
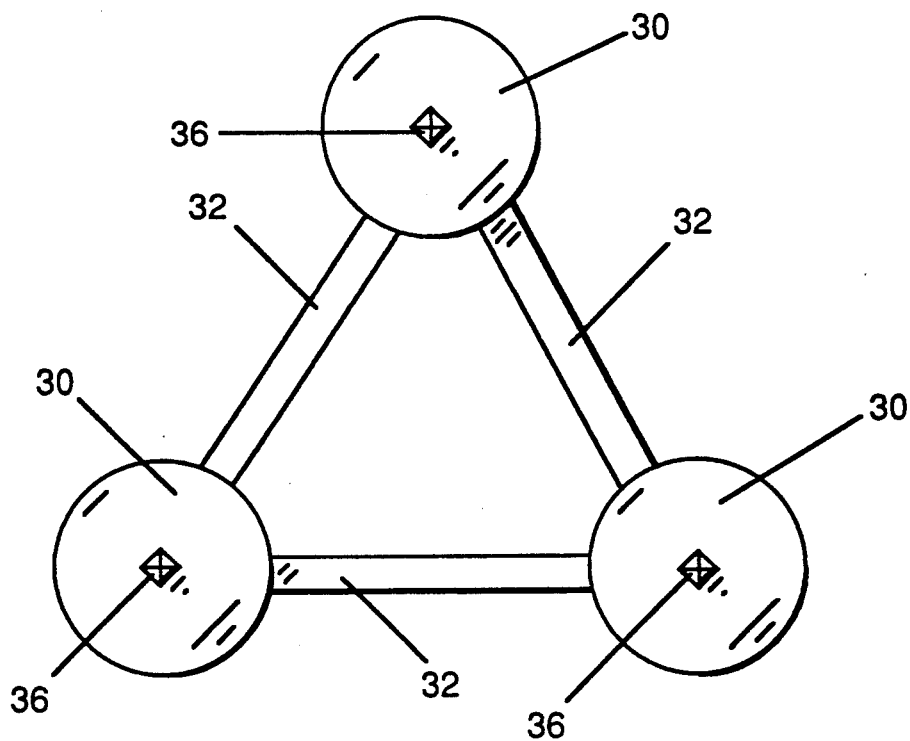
FIG. 3 is a top view of a manipulator.
Figure 5:
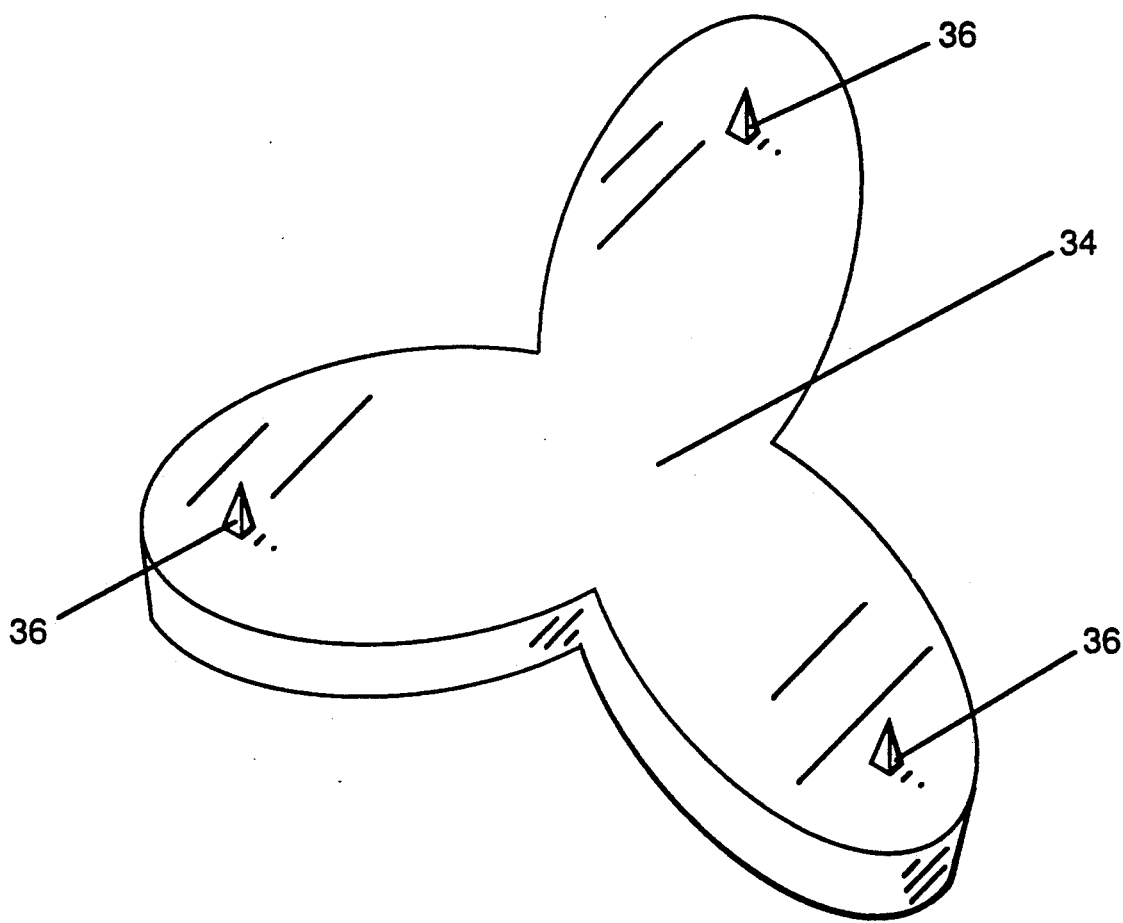
FIG. 5 is a plan view of a alternative embodiment of the manipulator of the present invention.

Referring now to FIG. 3, manipulator 14 is shown in a top view. In this preferred embodiment, manipulator 14 consists of three small permanent magnets 30 connected by structural members 32 so as to form an equilateral triangle with the permanent magnets 30 at the vertices. Permanent magnets 30 are bonded to structural members 32 by glue or any other method known in the art. Additionally, other geometric arrangements are possible outside this preferred embodiment. Further, the structural member 32 can be made out of magnetic material themselves or, as shown in FIG. 5, manipulator 14 can be machined out of a solid piece of magnetic material 34. This results in a rigid, solid manipulator requiring no bonding or joints.

Figure 4:
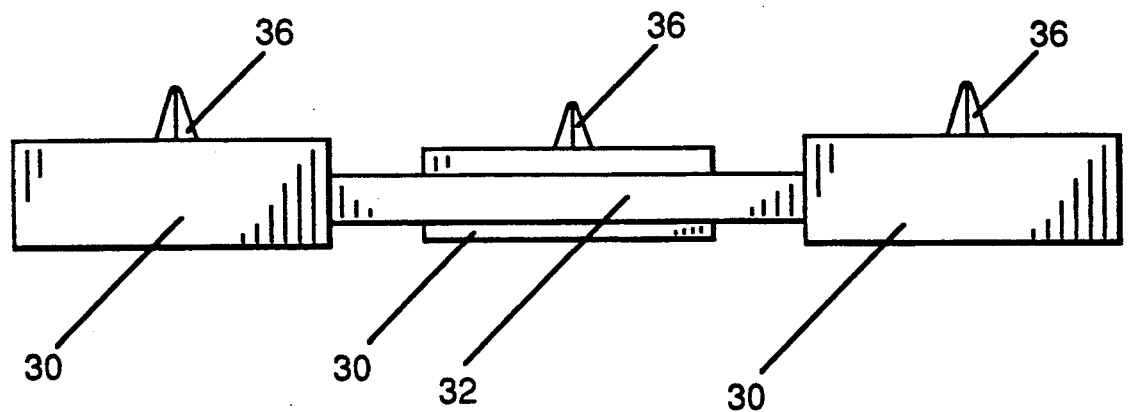
FIG. 4 is a side view of a manipulator.

Referring to FIG. 4, a side view of manipulator 14 is shown. An additional embodiment of manipulator 14 is to include contact members, legs, 36. Contact members 36 serve to minimize surface contact and, thereby, stiction (a form of friction caused by weak chemical bonding between surfaces). As discussed more fully in FIGS. 13 through 18, contact members 36 can also serve to inhibit certain degrees of freedom of movement and thereby reduce the demands on the computer control of electromagnets 12.

Figure 6A:
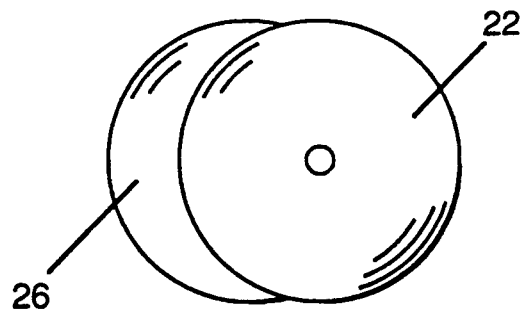
FIGS. 6a, 6b, 6c and 6d demonstrate how electromagnets in the present invention generate a net force that is horizontal.
Figure 6B:
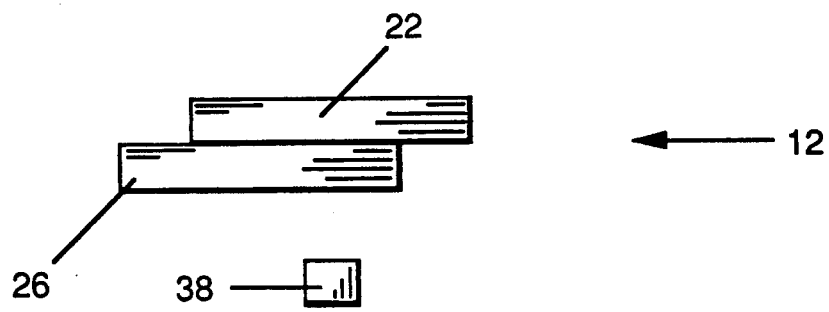
Figure 6C:
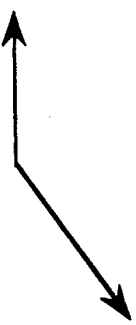
Figure 6D:

Referring now to FIGS. 6a and 6b, a top and side view of electromagnets 12 are shown, respectively. FIG. 6a and 6b demonstrate the effect of electromagnets 12 on a permanent magnet 38 whose magnetic dipole is pointed vertically upward. If the current in top solenoid 22 is positive or attractive, and the current in bottom solenoid 26 is negative, the net force is horizontal to the right. The free body diagram of forces on magnet 38 shown in FIG. 6c illustrates the forces due to the top and bottom electromagnets and FIG. 6d shows the resulting net force, or vector sum of the forces. If these currents are reversed so that the current in the top solenoid is negative and the current in the bottom solenoid is positive, the net force is horizontal to the left.

Figure 7A:
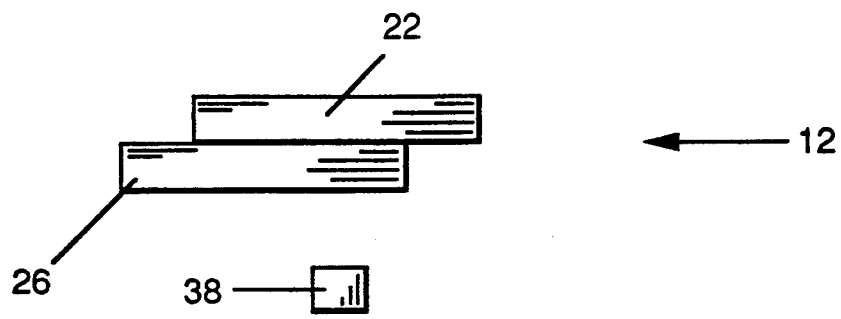
FIGS. 7a and 7b demonstrate how electromagnets in the present invention generate a net force that has both a vertical and horizontal component.
Figure 7B:

Referring now to FIG. 7a and 7b, if the current in top set 22 is zero, and the current in the bottom set 26 is negative, the resultant force has both a vertical and a horizontal component down and to the right. If these currents were reversed, the net force would have a vertical and horizontal component up and to the left.

Figure 8A:
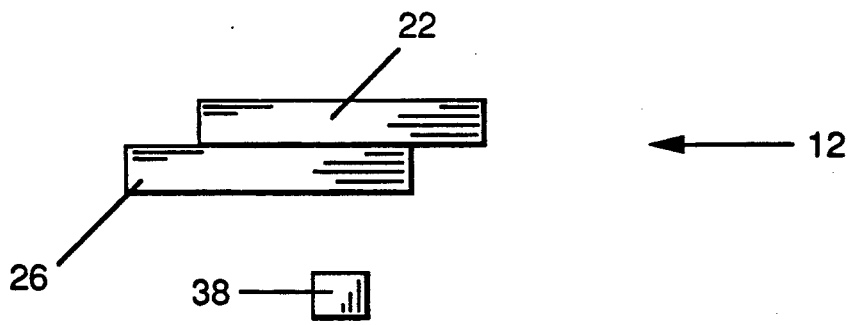
FIGS. 8a and 8b demonstrate how electromagnets in the present invention generate a net force that is vertical and up and which, if the current were reversed in the top solenoid, would be vertical and down.
Figure 8B:

Referring now to FIGS. 8a and 8b, if the current in top set 22 is positive and the current in bottom set 26 is zero, the net force on permanent magnet 28 is vertical in the upward position. If these were reversed, the net force would be vertical in the downward direction.

As a result of studying FIGS. 6a through 8b, and the discussion above, it is clear that by selecting currents from a group including zero, positive and negative, that an almost infinite variety of motions are available. A computer program can determine and record the exact combinations necessary to make a particular movement in a particular direction. Once a particular desired set of currents is determined, they can be repeated when required. As a result, control, by means of a computer, of current to electromagnets 12 enables the adjustment of the magnetic force fields necessary to move manipulator 14, or any like magnet, in a full six degrees of motion.

Figure 9:
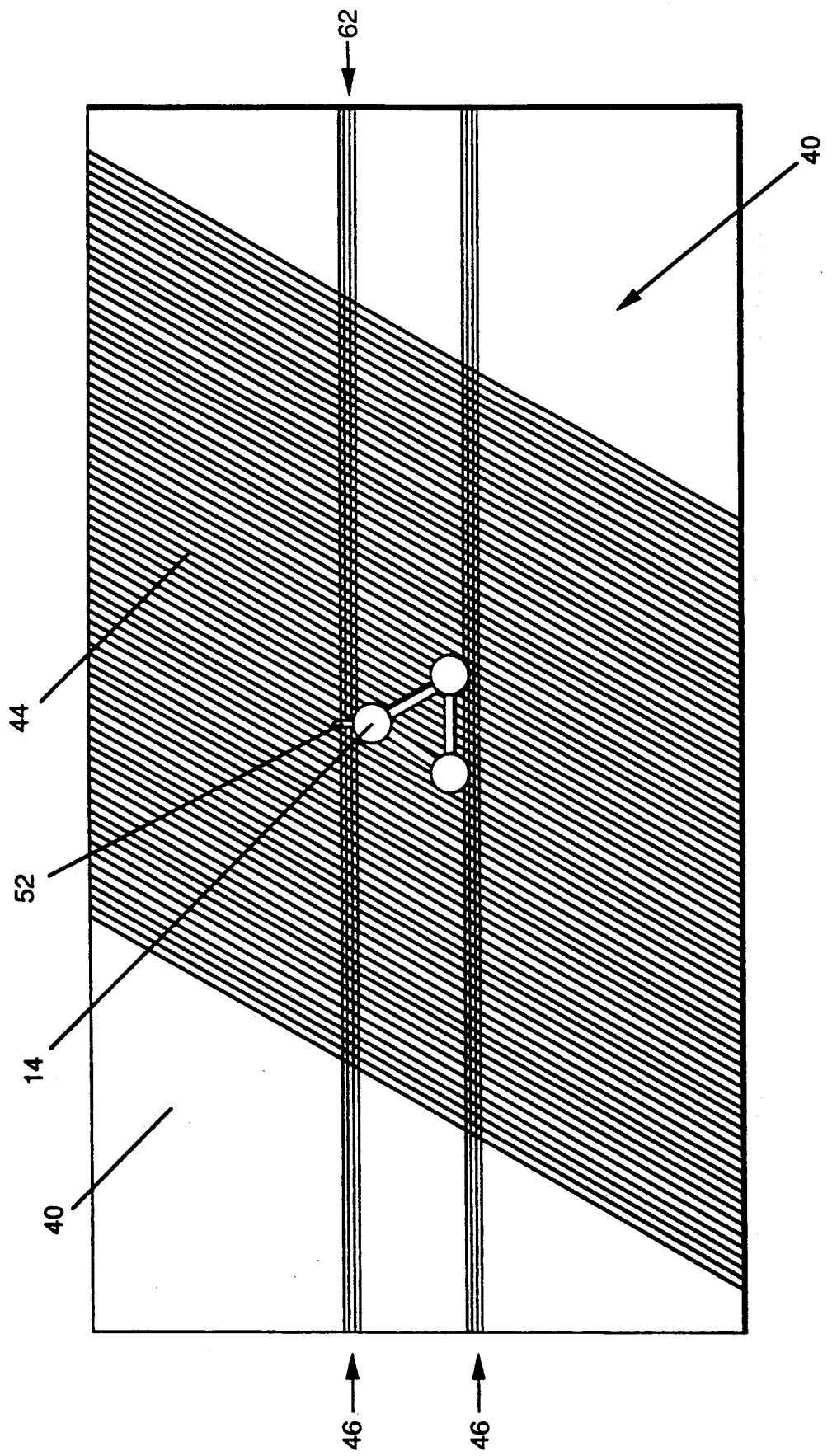
FIG. 9 is a demonstration of the transport path of the present invention using single wire drivers.

Referring now to FIG. 9, the conventional air core electromagnets 12 consisting of three dimensional coils of wire, have been replaced by a set of single wires 40 for movement of manipulator 14. In this embodiment, single wires 40 are laid down on a surface 42. Single wires 40 are divided into switching wires 44 and holding wires 46. The geometry of this set of wires is chosen to move manipulator 14 along a one-dimensional path and to minimize power consumption and errors in the forces and torques. Manipulator 14 is moved by the progressive application of electrical current to the switching wires 44 so that manipulator 14 moves in one of the two directions indicated by arrows 48. By applying current to holding wires 46 the manipulator 14 is prevented from moving in any other directions than those indicated by arrows 48. Additionally, by turning off the current applied to pivot holding wires 62, the manipulator 14 will pivot, or drop down, for the purpose of bringing end effector 52 away from transport path 50 for low precision limited degree of freedom tasks.

The advantages of these type of single wire electromagnets is that they can be fabricated using conventional methods used to make printed circuit boards or integrated circuits (e.g. photolithography). This, therefore, allows complex systems to be made cheaply, at much smaller scales, and with the sensor and controlling electronics integrated into the system. As a further result, transport paths 50 in the direction of arrows 48, for instance, can be linked to the precision workspaces 16, enabling complex systems controlling many mobile micro-robotic manipulators 14 to be fabricated cheaply.

Figure 10:
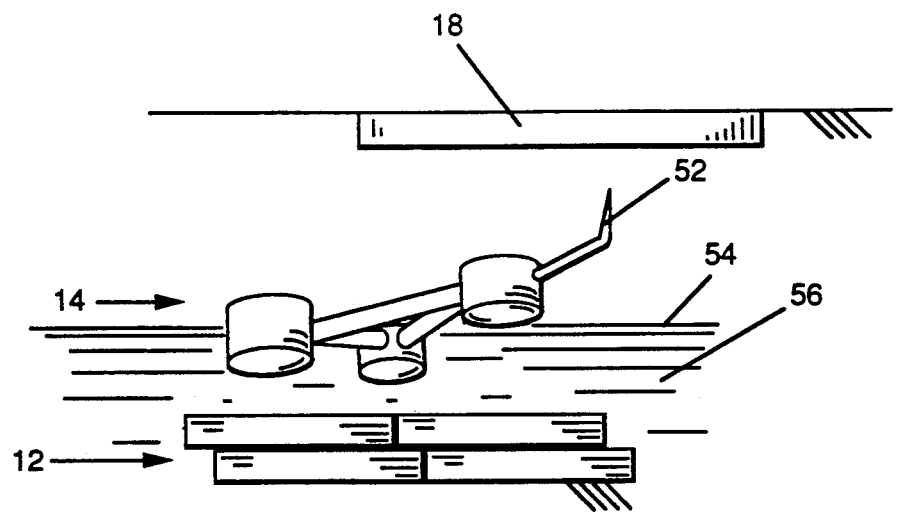
FIG. 10 is a side view of a preferred embodiment of the present invention utilizing liquid as a stabilizing and motion damping device.
Figure 11:
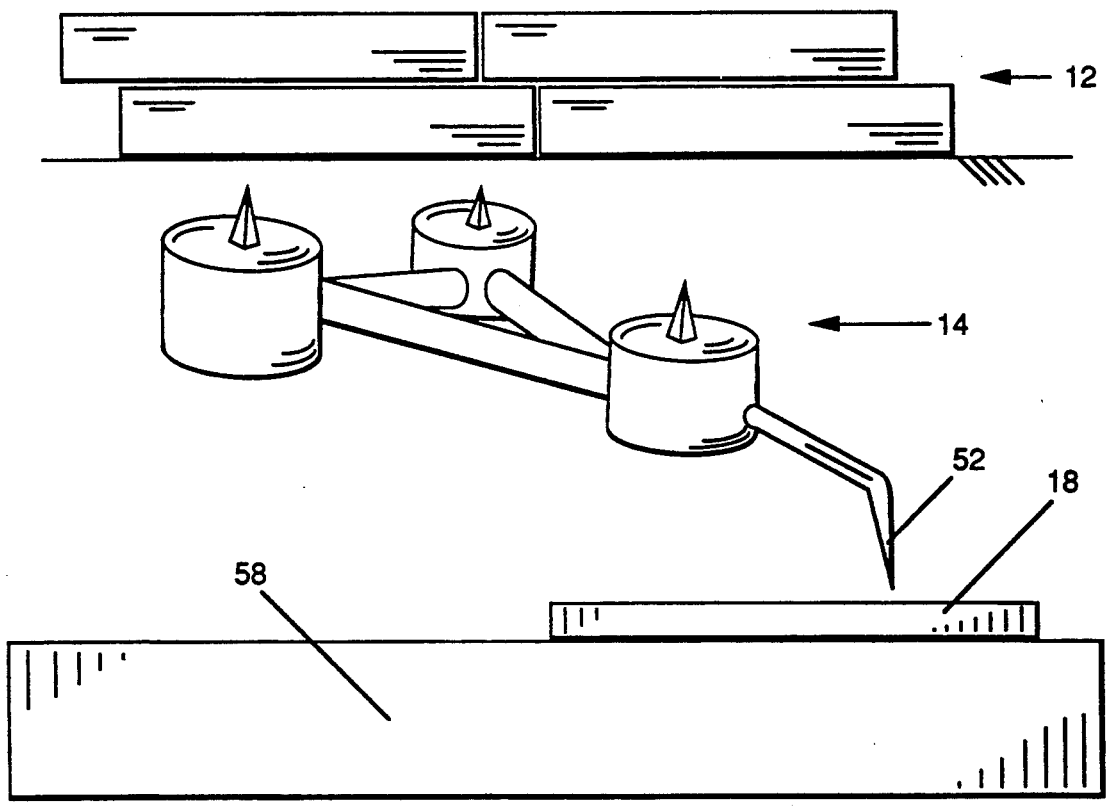
FIG. 11 is a side view of a preferred embodiment of the present invention utilizing a bulk superconductor for stabilizing and motion damping.

Referring now to FIGS. 1, 10, and 11, three means of providing stability and motion damping are illustrated. FIG. 1 demonstrates the utilization of solid surface 20. As previously stated, electromagnets 12 generate complex magnetic fields that act on the magnetic material 30 or 34 on manipulator 14. The electromagnets 12 are controlled by computer, with or without feedback. Electromagnets 12 and manipulator 14 can be oriented in any fashion relative to the vertical. With the manipulator 14 hanging below the electromagnets 12, however, one can apply a known force in the vertical direction using gravity. This aids in calibrating the micro-robot. Solid surface 20 is used for vertical stability, and lateral and vertical damping. As shown, contact members 36 contact solid surface 20 for stability and damping. Further, solid form 20 and process material 18 may be one in the same and manipulator 14 works upon and is stabilized, etc., by the process material 18 itself.

Additionally, solid surface 20 can be made of electrically conductive material so that electrical contact can be obtained with manipulator 14. In this embodiment, the motion of manipulator 14 is in the nature of a hopping motion, with solid surface 20 damping the motion at the end of each hop.

FIGS. 1, 10, and 11 show end effector 52 attached to manipulator 14. End effector 52 can be used to make simple electrical contact with material 18 to be worked on or can be utilized in more complex manners. In particular, contact members 36 may be utilized to transmit fluid from contact members 36 to end effector 52 for deposition on process material 18. In another embodiment, contact members 36 can be utilized to transmit mechanical energy from manipulator 14 to process material 18. And, in yet another embodiment, contact members 36 can be utilized to transmit light to end effector 52 and ultimately to process material 18.

Continuing with FIG. 10, another preferred embodiment is shown wherein manipulator 14 floats on the surface 54 of a fluid 56 using surface tension or buoyancy to support the manipulator without friction or stiction. The electromagnets 12 can be above or below the manipulator 14. Manipulator 14 has a high degree of precision without feedback just by using the fluid 56 to stabilize the motion without friction or stiction. The fluid 56 also serves to damp motion in all degrees of freedom by viscous damping. In this embodiment, electrical contact with manipulator 14 can also be made by using any of the methods described above, or by using electrically conductive fluid (e.g. mercury).

FIG. 11 demonstrates another preferred embodiment using bulk superconductor 58 to stabilize the motion. In this embodiment, the manipulator 14 floats without feedback between electromagnets 12 on top and the bulk super conductor 58 on the bottom. The phenomena allowing a stable float above the superconductor 58 is well known in the literature as the "Meissner effect". For a given set of currents in the electromagnets 12, there will be an equilibrium point where the manipulator 14 will float with stability. To move the manipulator 14, one would change the currents in the electromagnets 12 to form a new equilibrium point. The advantage of this embodiment is that the manipulator 14 can attain a high degree of precision without feedback. Note that, while floating, there is no surface stiction to prevent the manipulator 14 from attaining equilibrium location. In this embodiment, in order to get electrical signals to and from the manipulator 14, a wire tether can be attached, or a contact pad can be touched simultaneously with the circuit to be probed as in the embodiment in FIG. 1 utilizing solid surface 20.

Figure 12:
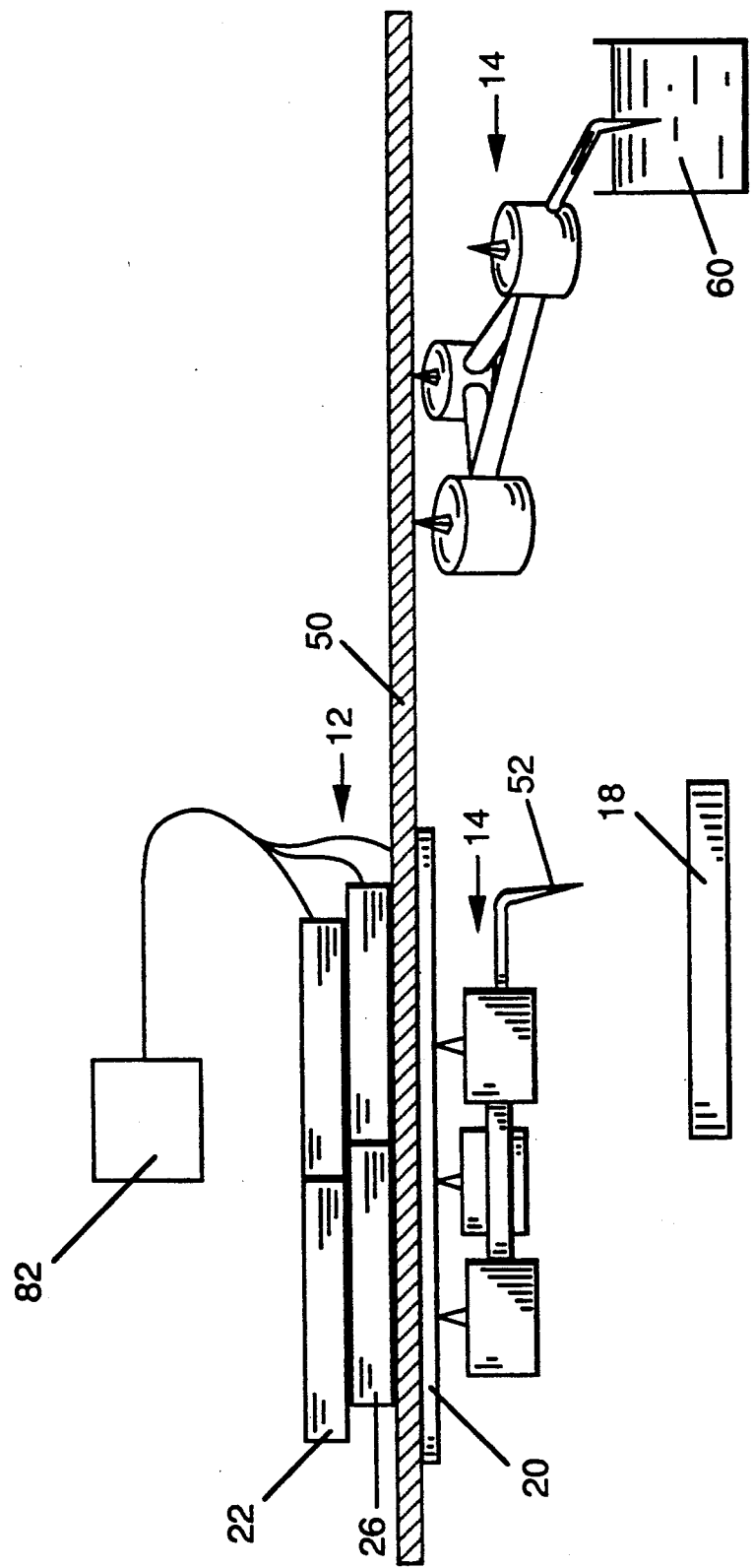
FIG. 12 is a side view of the present invention showing the transport path linked with a precision workspace so that one manipulator can be doing precision work while one manipulator, on the transport path does less precise work thereon.

As previously stated, all of the precision embodiments discussed above can be linked via transport paths 50. The transport paths 50 themselves, resemble D.C. motors. Unlike D.C. motors, however, this invention incorporates configurations that allow the manipulators 14 to pivot or drop down to bring materials or end effectors 52 into an area for additional processing. Referring to FIG. 12, a transport path 50, a precision workspace 16 with a manipulator 14, and a processing segment of a transport path 50 with another pivoted manipulator 14 immersing its end effector 52 into a solution (e.g. for a cleaning operation) is shown. As a result, once manipulator 14 in the precision workspace 16 has accomplished its work, it can exit the precision workspace 16 on transport path 50 and, en route along transport path 50, accomplish some other low precision task such as cleaning end effector 52 by dipping it in cleaning solution 60. Once again, complex systems controlling many mobile micro-robot manipulators 14 can be fabricated cheaply in accordance with this invention.

Figure 13:
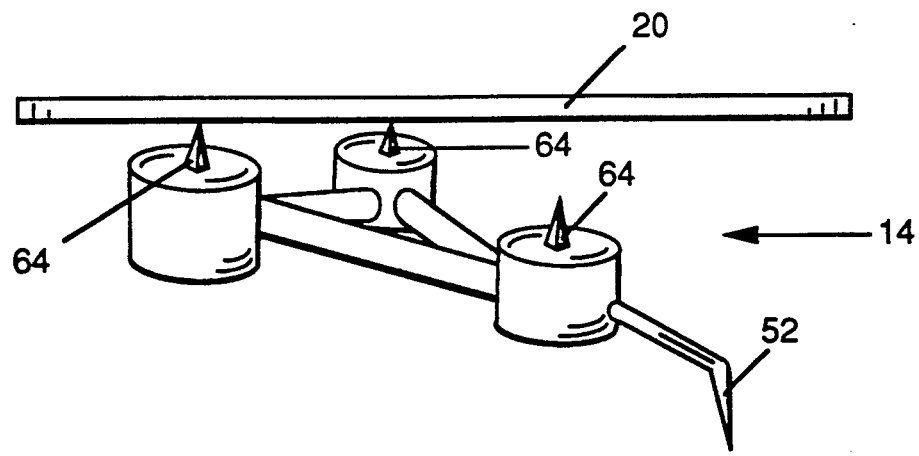
FIG. 13 is a side view of a preferred embodiment of the manipulator using needle-like contact members to make contact with a flat solid surface and rotating about the points of contact in an uninhibited degree of freedom.

Referring now to FIG. 13, when contact is made between manipulator 14 and solid surface 20, liquid 56, or liquid surface 54, certain degrees of freedom, i.e. types of motion, become inhibited, while other remain essentially uninhibited: Which degrees of freedom become inhibited can be controlled by controlling the shape of contact member 36 and/or controlling the shape of solid surface 20. FIG. 13 shows three pin contact members 64 in the shape of pins or pointed needle-like projections from manipulator 14. Solid surface 20 can be made in the form of a flat plate or plane solid surface 76, which is shown edge on in FIG. 13. When one pin contact member 64 is in contact with plane solid surface 76, all motions of manipulator 14 which will move the contact pin contact member 64 along or into place solid surface 76 are inhibited. These inhibited motions are inhibited because of friction and other contact forces. However, rotations about any axes through the point of contact, and movement of the contact pin contact member 64 off the surface, are essentially uninhibited. When two pin contact members 64 are in contact with plane solid surface 76, as shown in FIG. 13, rotations about any axis perpendicular to the surface are additionally inhibited by contact forces. It can be seen that rotation about the axis connecting the two points of contact in FIG. 13 is uninhibited. This particular rotation is significant because it can be used to bring end effector 52 down to process material 18 as shown in FIG. 1. A useful way to control manipulator 14 is to first position two points of contact between pin contact members 64 and plane solid surface 76 by hops off and across plane surface 76, followed by rotation about the axis connecting the two points of contact to bring the end effector 52 down to process material 18. Such magnetic levitation, apparatus and methods are advantageous because all degrees of freedom that are controlled do not have to be controlled simultaneously by the computer.

Figure 14:
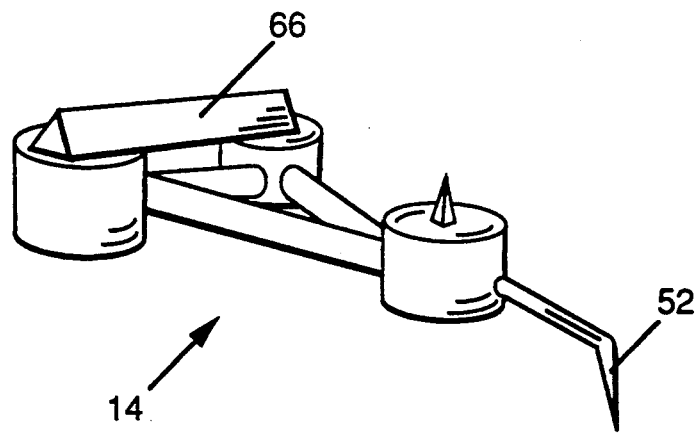
FIG. 14 is a plan view of an alternate embodiment of the manipulator using a knife or straight edge contact member for use with solid surfaces.

Referring now to FIG. 14, a knife or straight edge contact member 66 is shown. Using a plane solid surface 76, a manipulator 14 with a knife edge contact member 66 has the same inhibited and uninhibited degrees of motion during contact as does a manipulator 14 with pin contact members 64 when two of its pin contact members 64 are in contact with plane solid surface 76. Knife edge contact member 66 offers advantages, however, in terms of wear over pin contact members 64.

Figure 15:
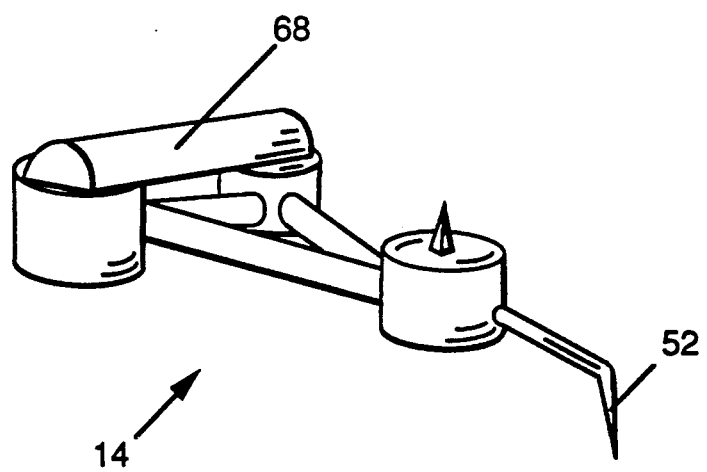
FIG. 15 is a plan view of an alternate embodiment of the manipulator using a round or rolling edge contact member for use with solid surfaces.

Referring now to FIG. 15, a cylindrical or curved contact member 68 is shown. Curved contact member 68 has properties that are similar to knife edge contact member 66, except that an uninhibited rotation about the line of contact with plane solid surface 76 also generates some translational movement, as well, due to the rolling motion.

Figure 16:
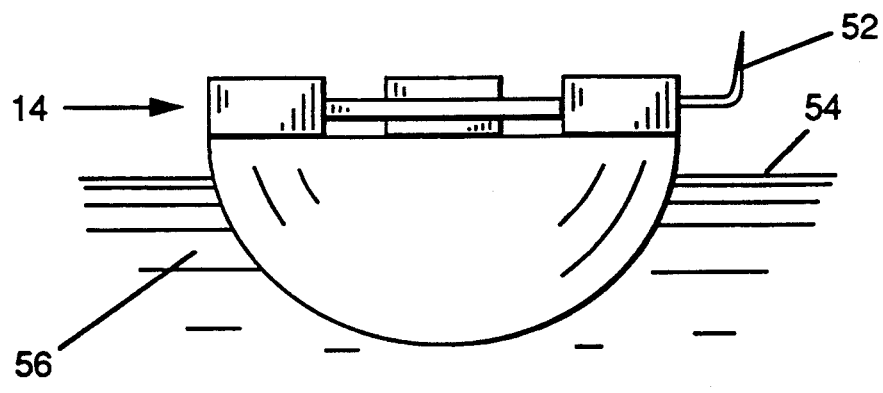
FIG. 16 is a side view of an alternate embodiment of the manipulator with a attached curved shaped contact member for use with liquid means of support and having uninhibited rotations of the manipulator.

Referring now to FIG. 16, a curved contact member 70 is shown supported by fluid 56 and surface 54, curved contact member 70 inhibits translational motion due to viscous or buoyancy effect when in contact with fluid 56. Rotational motion can be considered essentially uninhibited due to the much smaller viscous forces for this type of motion. Curved contact member 70 is useful for tasks emphasizing rotational motion, such as mirror pointing.

Figure 17:
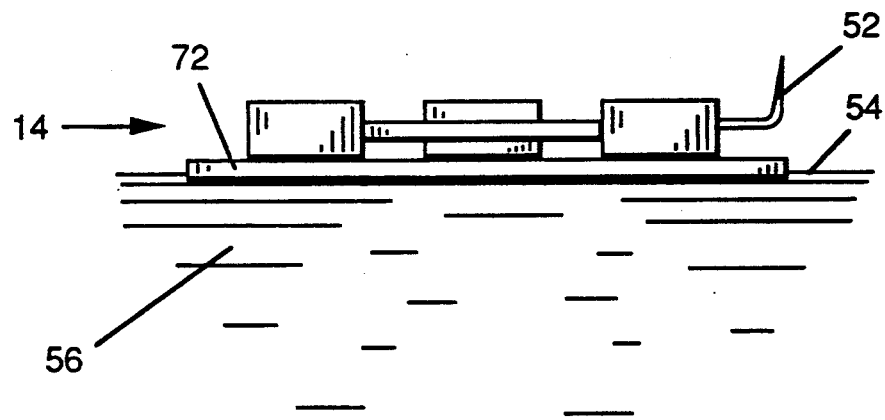
FIG. 17 is a side view of an alternate embodiment of the manipulator with an attached horizontal flat plate contact member for use with liquid means of support.

FIG. 17 shows a horizontal plate contact member 72 supported by fluid 56 and surface 54. Rotational and translational motion along the surface is essentially uninhibited, while other motions are inhibited. The horizontal plate contact member 72 is useful for tasks requiring large planar motions but only small vertical motions, such as probing a microchip.

Figure 18:
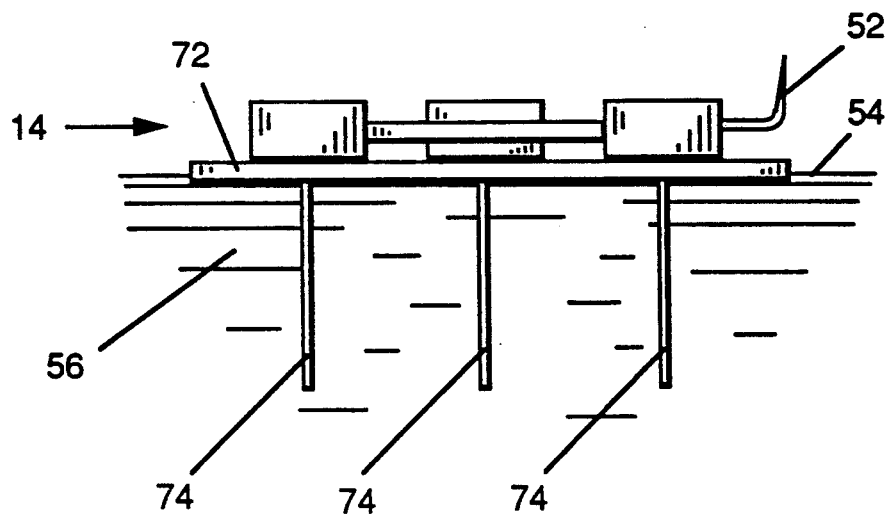
FIG. 18 is a side view of an alternate embodiment of the manipulator with attached vertical place contact members for use with liquid means of support.

Referring now to FIG. 18, a side view is shown of three vertical plate contact members 74 added to the horizontal plate contact member 72, with all plates, seen edge on, supported by fluid 56 and surface 54. This combination of contact members inhibits motion in all directions except for the translational direction defined by the intersection of horizontal plate contact member 72 and any one of the vertical plate contact members 74. The combination of vertical plate contact members 74 and horizontal plate contact member 72 is useful for tasks emphasizing a single fast direction, such a raster scanning tasks.

Figure 19:
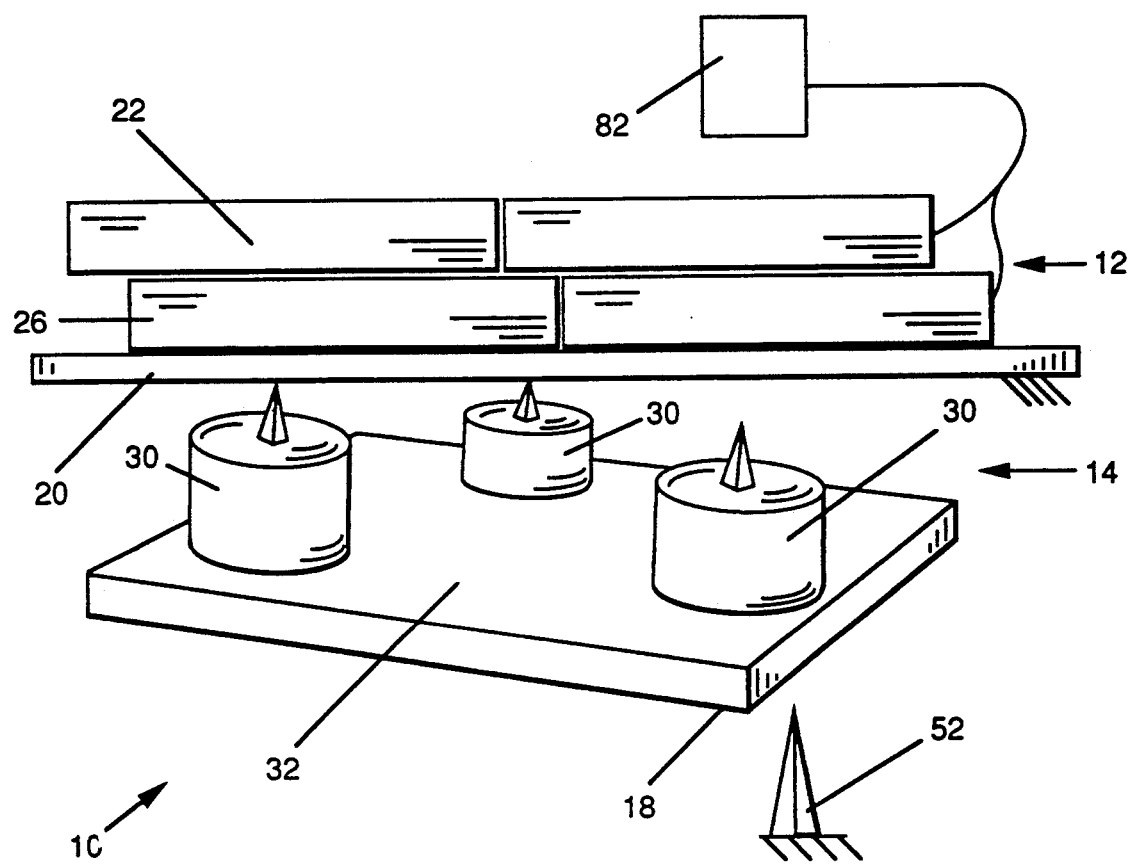
FIG. 19 is a side view of a preferred embodiment showing how process material can be used as structural material in the manipulator, with the end effector (a word of art in robotics meaning a tool such as a gripper, probe tip, etc. normally attached to a robot) or tool fixed in the workspace.
Figure 20:
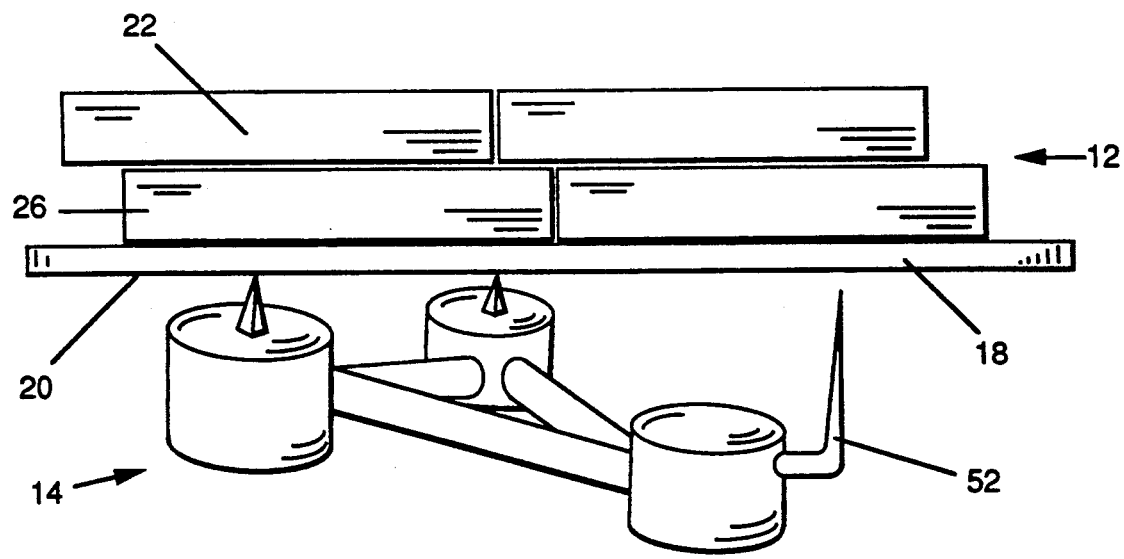
FIG. 20 is a side view of a preferred embodiment showing how process material can be used as a solid surface to stabilize and damp the micro-robot.

FIGS. 19 and 20 show the flexibility encompassed by this invention. FIG. 19 shows a magnetic levitation system 10 where the process material 18 and the structural member 32 are one and the same. Permanent magnets 30 are glued or otherwise attached to process material 18 to form manipulator 14. In the embodiment shown in FIG. 19, the tool or end effector 52 is fixed in the workspace.

FIG. 20 shows a levitation system where process material 18 and solid surface 20 are one and the same. In the embodiment shown in FIG. 20, the position of end effector 52 on manipulator 14 has been changed relative to its position shown in FIG. 1.

Because this invention allows for transporting various manipulators into and out of a precision workspace as discussed previously in connection with FIG. 12, given precision workspace can make use of a variety of manipulators with a variety of contact members, each optimized for a given type of motion or task. This allows great flexibility in a manufacturing environment.

In accordance with this invention, a robot is any multi-degree of freedom, programmable, mechanical device used to position and control an end effector (i.e. a tool). It is with respect to this definition that the magnetically levitated micro-machines disclosed wherein are referred to as "micro-robots". The device of the present invention does not look like a conventional robot, nonetheless, magnetically levitated micro-robots are used for the same types of mechanical operations as conventional robots.

Probably the simplest tool, or end effector 52, that can be positioned by a manipulator 14 is a needle. The needle can be brought in contact with different parts of an electrical circuit to make useful measurements, such as the voltage at various points in a circuit. This is an example of a probing application, and the needle would be referred to as a probe tip.

If the points on the electrical circuit to be probed, are large, the probing can be done by a human or by mechanical devices including conventional robots. On the other hand, if the points to be probed are very small, say one micron (40 millionths of an inch) or less, it becomes difficult for a human to position the probe tip accurately, even using a microscope. Accuracy is also difficult to achieve using conventional mechanical devices or robots known in the art. The problem becomes more difficult still if one wants to probe many points quickly at low cost. A typical micro-chip may contain 100,000 components. Such a chip can sell for a couple of dollars, so that if one wanted to routinely probe each component, it would have to be done at a very low cost to justify the benefit. In current practice, each component can not be probed because the benefit in terms of reliability and quality control, of micro-chip production is insufficient to justify the cost. Instead, the present economics allow only a relatively few probes made per chip, and those probes are usually made on larger features of the chip. Because probe tips smaller than one micron are readily available, it is clear that probe tips are not the problem, but precision, speed, and cost are.

The magnetically levitated manipulators of the present invention are expected to have high speed, sometimes in excess of 100 moves, or probes, per second. They are low cost and highly accurate. These characteristics make them well suited for probing applications compared to other mechanical devices. There are other probing applications besides electrical that are useful. Even easier than the electric probing, for example, is just probing to map the variations in height along a surface. In this application, the manipulator 14 accurately positions itself over the surface. Next the manipulator moves downward, or pivots, until it makes contact with the surface and can not move down further. The vertical height of the manipulator 14 and, by implication, the vertical height of the surface, is then recorded using the sensors that control the motion of the manipulator 14. By measuring the height at many different points, one can build up a topographical map of the surface. A cheap, accurate surface mapper would be useful in materials science or in micro-chip manufacturing.

Other potentially feasible applications exist. One good example is that of a micro-robot that picks up and places very small objects, say, objects that are a micron on a side. A micro-robot that can do this then enables the creation of devices and materials which have never been made before. The use of a "pick and place" micro-robot is better understood by a knowledge of how integrated circuits are made. Integrated circuits (ICs) are manufactured with virtually no testing of individual components as mentioned in the probe application above. If one out of the 100,000 components that make up a typically silicon-based integrated circuit is faulty, then the entire chip is discarded, assuming the fault was detected in the first place. The percentage of processed IC's that are fully functional is known as the yield. For some types of integrated circuits a yield of only twenty to thirty percent is considered good. An obvious extension of the probe application is, therefore, to replace faulty components in an integrated circuit that would otherwise be discarded. Since the yield plays a major role in the economics of integrated circuit manufacturing, being able to repair faulty components is a significant advance.

Another aspect of manufacturing IC's is known as the level of integration. The level of integration of an IC refers to the number of individual components (transistors, resistors, capacitors, etc.) that make up the circuit. The level of integration that is possible with a circuit depends upon the type of material used. Silicon, which is the best understood semi-conductor material, can be used to make the highest level of integration. There are a host of other materials, including both semi-conductors and more exotic materials, which have a much lower level of integration. These materials, however, are often superior to silicon in terms of speed of the circuit or power consumption, but because they are newer, are more difficult to work with, they can not, as yet, be used to make highly integrated circuits. Since the micro-robot of the present invention can test a component before it is placed in the circuit, it should be possible to achieve a higher level of integration than is possible with methods that do not allow for component testing.

While the present invention has been disclosed in connection with the preferred embodiment thereof, it should be understood that there may be other embodiments which fall within, the spirit and scope of the invention as defined by the following claims.

What is claimed is:

1. A magnetically driven micro-robot comprising:
   a). fixed magnetic means comprising multiple electromagnet means which can produce magnetic fields when said multiple electromagnet means are driven with respective electrical currents;
   b). manipulator means, responsive to said magnetic fields for producing motion, comprising:
      i. permanent magnet means for producing magnetic forces and torques in response to said magnetic fields;
      ii. end effector means which can do useful work when positioned in space;
   c). contact member means which projects from and is rigidly attached to said manipulator means for making mechanical contact;
   d). substantially planar, fixed solid surface means for providing stability and dampening the motion of said manipulator means when said contact member means mechanically contact said substantially planar, fixed solid surface means; and
   e). programmable control means which generates and controls said electrical currents through said multiple electromagnet means, thereby controlling the motion of said manipulator means and said end effector means with multiple, controllable degrees of freedom of motion.

2. The microrobot of claim 1 wherein said manipulator means is located below said substantially planar, fixed solid surface means so that gravity pulls said manipulator away from said solid surface with a known force equal to the weight of said manipulator, thereby improving and simplifying control of the motion of said manipulator in the vertical direction.

3. The microrobot of claim 1 wherein said multiple electromagnet means are air core electromagnet means, thereby allowing precise control of said magnetic fields and the motion of said manipulator means.

4. The microrobot of claim 1 wherein said contact member means is relatively small in relation to said manipulator means for the purpose of reducing the area of mechanical contact between said manipulator means and said substantially planar, fixed solid surface means, thereby reducing friction effects and improving position control of said manipulator means.

5. The microrobot of claim 4 wherein said contact member means is selected from the group consisting of knife edge contact members and pin contact members, thereby allowing said manipulator means to rotate about points of mechanical contact when said contact member means are in mechanical contact with said substantially planar, fixed solid surface means.

6. The microrobot of claim 4 wherein said contact member means comprises curved surface contact member means, thereby allowing said manipulator means to roll on said contact member means when said contact member means are in mechanical contact with said substantially planar solid surface means.

7. A magnetically driven micro-robot comprising:
   a). fixed magnetic means comprising multiple electromagnet means which can produce magnetic fields when said multiple electromagnet means are driven with respective electrical currents;
   b). manipulator means, responsive to said magnetic fields for producing motion, comprising:
      i. permanent magnet means for producing magnetic forces and torques in response to said magnetic fields;
      ii. end effector means which can do useful work when positioned in space;
   c). contact member means which projects from and is rigidly attached to said manipulator means for making mechanical contact;
   d). unpressurized liquid means for providing stability and dampening the motion of said manipulator means when said contact member means mechanically contacts said unpressurized liquid means; and
   e). programmable control means which generates and controls said electrical currents through said multiple electromagnet means, thereby controlling the motion of said manipulator means and said end effector means with multiple, controllable degrees of freedom of motion.

8. A magnetically driven micro-robot comprising:
   a). fixed magnetic means comprising multiple air core electromagnet means which can produce magnetic fields when said multiple air core electromagnet means are driven with respective electrical currents;
   b). manipulator means, responsive to said magnetic fields for producing motion, comprising:
      i. permanent magnet means for producing magnetic forces and torques in response to said magnetic fields;
      ii. end effector means which can do useful work when positioned in space;

c). said manipulator means being located on only one side of each of said air core electromagnet, thereby allowing said manipulator means freedom of motion away from said side;

d). substantially planar, fixed solid surface means for providing stability ad dampening the motion of said manipulator means;

e). programmable control means which generates and controls said electrical currents through said multiple electromagnet means, thereby controlling the motion of said manipulator means and said end effector means with multiple, controllable degrees of freedom of motion;

f). said substantially planar, fixed solid surface means being located above said manipulator means so that the gravity force on said manipulator means is directed away from said substantially planar, fixed solid surface means, thereby simplifying and improving control and calibration for the vertical direction of motion; and g). said programmable control means controls said respective currents to said air core electromagnet means so that at least one of said respective currents is selected from a group including zero, positive and negative, thereby improving control by allowing said programmable control means to control said magnetic forces so that zero, positive, or negative force can applied in at least one direction.

9. A magnetically driven micro-robot comprising:
a). fixed multiple electromagnet means which can produce magnetic fields when said multiple electromagnet means are driven with respective electrical currents;
b). unattached manipulator means, responsive to said magnetic fields for producing motion, comprising:
   i. permanent magnet means for producing magnetic forces and torques in response to said magnetic fields;
   ii. end effector means which can do useful work when positioned in space;
c). electrically conductive contact member means which projects from and is rigidly attached to said manipulator means for making mechanical contact;
d). electrically conductive, stabilization and damping means selected from the group consisting of electrically conductive liquids and electrically conductive, substantially planar solid surfaces for providing stability and dampening the motion of said manipulator means whereby electrical contact with said manipulator means can be made when said electrically conductive means is supplied with electricity and said electrically conductive contact member means is in contact with said electrically conductive, stabilization an damping means; and
e). programmable control means which generates and controls said electrical currents through said electromagnet means, thereby controlling the motion of said manipulator means and said end effector means with multiple, controllable degrees of freedom of motion.

10. A magnetically driven micro-robot transport path, comprising:
a). fixed, multiple electromagnet means which can produce magnetic fields when said multiple electromagnet means are driven with respective electrical currents;
b). manipulator means, responsive to said magnetic fields for producing motion, comprising:
   i. movable magnet means for producing magnetic forces and torques in response to said magnetic fields;
   ii. end effector means which can do useful work when positioned in space;
c). each one of said multiple electromagnet means further comprising no more than two layers of electrical wires in the vicinity of said manipulator means, said electrical wires being driven by said electrical currents;
d). each one of said layers of electrical wires being only a single wire thick;
e). stabilizing and motion damping means for stabilizing and damping the motion of said manipulator means; and
f). programmable control means for generating and controlling said electrical currents through said multiple electromagnet means, thereby controlling the motion of said manipulator means with at least one controllable degree of freedom of motion.

11. The micro-robot transport path of claim 10 wherein said fixed, multiple electromagnet means is comprised of less than 7 of said layers of electrical wires, thereby allowing said fixed, multiple electromagnet means to be made using process which are limited to making less than 7 layers of wires.

12. The micro-robot transport path of claim 10 wherein said stabilizing and motion dampening means comprises substantially planar solid surface means.

13. The micro-robot transport path of claim 10 wherein said stabilizing and motion dampening means comprises liquid means.

14. The micro-robot transport path of claim 10 wherein said stabilizing and motion dampening means comprises superconductor means.

15. The micro-robot transport path of claim 10 wherein said electrical wires are sensibly straight in the vicinity of said manipulator means, thereby forming an electromagnet which can be made long and thin.

16. The micro-robot transport path of claim 10 wherein said electrical wires of one of said electromagnet means forms an angle with said electrical wires of at least one other of said electromagnet means, said angle being selected from a group which consists of oblique angles and perpendicular angles, thereby allowing control of said manipulator means with more than one controllable degree of freedom of motion.

17. The micro-robot transport path of claim 10 further including:
a). at least one fixed coil electromagnet means for producing magnetic fields, each one of said coil electromagnet means comprising coils of wire which are more than two wires thick;
b). said fixed coil electromagnet means being connected to and controlled by said programmable control means; and
c). said fixed coil electromagnet means being located in proximity to said fixed multiple electromagnet means so that said programmable control means can control the motion of said manipulator means using either said coil electromagnet means or said fixed multiple electromagnet means, whereby a flexible automation system is for med which can control said manipulator means in different ways in different locations.

18. A magnetic levitation micro-robot, comprising:
a). fixed magnetic means comprising multiple electromagnet means which can produce magnetic fields when driven by respective electric currents, and which are located on one side of a substantially planar surface;

b). said multiple electromagnet means further comprises top electromagnet means and bottom electromagnet means, each one of said top electromagnet means being located above and contiguous with at least one of said bottom electromagnet means;

c). manipulator means, located on the opposed side of said substantially planar surface from said fixed magnetic means, and responsive to said magnetic fields for producing motion, comprising:
  i. moveable magnetic means which can produce magnetic forces and torques in response to said magnetic fields;
  ii. end effector means which can do useful work when positioned in space;

d). stabilizing and motion dampening means selected from the group which consists of liquid and solid surface means for stabilizing and dampening the motion of said manipulator means; and e). programmable control means which generates and controls said electrical currents through said electromagnets, thereby controlling the motion of said manipulator means and said end effector means with up to six, controllable degrees of freedom of motion.

19. The magnetic levitation microrobot of claim 18 wherein said multiple electromagnetic means further comprising:
  a). said top electromagnetic means comprises shaped electromagnetic means spaced so that the centers of said shaped electromagnetic means forms an equilateral triangle;
  b). wherein said bottom electromagnet means comprises shaped electromagnetic means, corresponding to said top set, spaced so that the centers of said bottom electromagnetic means forms an equilateral triangle; and
  c). wherein said top and bottom electromagnet means are joined so that the central axes of said top electromagnet means are offset from the central axes of said bottom electromagnet means by a factor of a common radius of said electromagnet means, thereby forming a magnetic levitation microrobot drive system which has low power consumption and can be controlled with six controllable degrees of freedom of motion.

20. The magnetic levitation microrobot of claim 18 wherein said moveable magnet means comprises a permanent magnet means formed from a unitary piece of permanent magnet material.

21. The magnetic levitation microrobot of claim 18 wherein said moveable magnetic means comprises a plurality of permanent magnet means, and said manipulator means further comprises structural means attached to and interconnecting said permanent magnet means.

22. The magnetic levitation microrobot of claim 21 wherein said plurality of permanent magnet means is fewer than six permanent magnet means, thereby forming a microrobot which can be controlled with six controllable degrees of freedom of motion but which has fewer than six permanent magnets.

23. A magnetically driven microrobot system comprising:
  a). fixed magnetic means comprising fixed, multiple electromagnet means which can produce magnetic fields in response to respective electrical currents;
  b). said fixed, multiple electromagnet means further comprising a regularly spaced array of transport electromagnet means and a set of local electromagnet means;
  c). said local electromagnet means being located in proximity to and prolapsed with respect to said regularly spaced array of transport electromagnet means;
  d). a plurality of manipulator means, responsive to said magnetic fields, for producing motion; each of said manipulator means comprising:
    i. moveable magnetic means which can produce magnetic forces and torques in response to said magnetic fields;
    ii. end effector means which can do useful work when positioned in space;
  e). said regularly spaced array of transport electromagnet means being at least three times as long in one dimension as one of said manipulator means;
  f). stabilization and motion damping means for providing stability and dampening the motion of said manipulator means; and
  g). programmable control means which generates and controls said electrical currents through said fixed, multiple electromagnet means, whereby a plurality of said manipulator means can be controlled with multiple, controllable degrees of freedom of motion using said local electromagnet means by moving said manipulator means into and out of the vicinity of said local electromagnet means using said transport electromagnet means.

* * * * *